(12) United States Patent
Saeki et al.

(10) Patent No.: US 9,402,309 B2
(45) Date of Patent: Jul. 26, 2016

(54) PRINTED WIRING BOARD AND METHOD OF PRODUCING THE SAME

(71) Applicant: KYOCERA Circuit Solutions, Inc., Kyoto (JP)

(72) Inventors: Shinri Saeki, Shimoniikawa-gun (JP); Takashi Ishioka, Namerikawa (JP); Satoshi Nakamura, Kurobe (JP)

(73) Assignee: Kyocera Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 14/750,161

(22) Filed: Jun. 25, 2015

(65) Prior Publication Data

US 2015/0382458 A1     Dec. 31, 2015

(30) Foreign Application Priority Data

Jun. 30, 2014 (JP) ................. 2014-134829

(51) Int. Cl.
| | |
|---|---|
| *H05K 1/02* | (2006.01) |
| *H05K 3/18* | (2006.01) |
| *C25D 5/02* | (2006.01) |
| *H05K 1/11* | (2006.01) |

(52) U.S. Cl.
CPC ............. *H05K 1/0298* (2013.01); *C25D 5/022* (2013.01); *H05K 1/115* (2013.01); *H05K 3/188* (2013.01)

(58) Field of Classification Search
CPC .... H05K 1/0296; H05K 1/0298; H05K 3/188
See application file for complete search history.

(56) References Cited

U.S. PATENT DOCUMENTS

2007/0065988 A1     3/2007   Jung et al.

FOREIGN PATENT DOCUMENTS

| JP | 2003-008222 A | 1/2003 |
|---|---|---|
| JP | 2007-088476 A | 4/2007 |
| JP | 2010-087213 A | 4/2010 |

*Primary Examiner* — Jeremy C Norris
(74) *Attorney, Agent, or Firm* — Volpe and Koenig, P.C.

(57) ABSTRACT

The printed wiring board includes: an insulating board including a conductive metal layer formed on both surfaces of an insulating resin; and a conductor layer formed on both surfaces of the insulating board, the conductor layer including a different circuit pattern depending on a region. The circuit patterns formed on both surfaces of the insulating board includes a pattern with line width accuracy of ±10 μm or less, and a conductor layer thickness in a region having a dense circuit pattern area and a conductor layer thickness in a region having a sparse circuit pattern area have a following relational expression:

conductor layer thickness in a dense region/conductor layer thickness in a sparse region=0.7 to 1.0.

10 Claims, 4 Drawing Sheets

PRINTED WIRING BOARD AND METHOD OF PRODUCING THE SAME

BACKGROUND OF THE INVENTION

1. Technical Field

The present invention relates to a printed wiring board having a small difference in thickness between the conductor layers formed on the front and back surfaces and a producing method thereof.

2. Background

When a circuit is formed on a board, there are a subtractive method and an additive method. The subtractive method includes a limit to forming a fine pattern because the accuracy of the circuit width is determined by the conductor thickness as described in JP 2010-87213 A.

In contrast to this, the additive method is excellent in the high-precision fine pattern formation of, for example, ±10 μm in the circuit width of 50 μm or less because the accuracy of the circuit width is hardly affected by the conductor thickness. The additive method includes a full-additive method and a semi-additive method, and the mainstream technology is the semi-additive method. Furthermore, the semi-additive method includes a MSAP (Modified Semi Additive Process) as the derived technology.

In the semi-additive method, a seed layer of electroless plating is formed on the entire insulating resin, and a plating resist is formed on the seed layer as described in JP 2003-8222 A and JP 2007-88476 A. Then, the plating resist is exposed and developed, and the plating resist in a place where a circuit pattern, a via hole and the like are desired to be formed is removed. Then, a circuit pattern, a via hole, and the like are formed by electrolytic pattern plating in the portion where the plating resist is removed. Lastly, the plating resist is removed, the seed layer (electroless plating layer) is removed by flash etching, and the electroless plating catalyst is removed, whereby a circuit is formed.

MSAP uses the copper laminated on the insulating resin layer as a seed layer as described in JP 2007-88476 A, and is the same as the semi-additive method except that the catalyst removal is not required. In MSAP, when a via hole is formed, the electroless plating is required as a seed layer at least on the inner wall of a hole formed as a via hole, however, the electroless plating on the entire insulating resin surface is not required as in the semi-additive method. Therefore, the seed layer can be formed relatively easily. Furthermore, there is no need to remove the palladium used as the catalyst during the electroless plating. Based on these characteristics, the MSAP can form a fine circuit relatively more easily than the semi-additive method.

In the subtractive method described in JP 2010-87213 A, the lower part of the circuit becomes skirt shape trailing long on both sides. The trailing amount is determined by the thickness of the conductor layer, and the thinner the circuit is, the higher the ratio of the trailing amount to the circuit width is. Therefore, when a fine circuit is attempted to be formed, the cross-sectional shape of the conductor layer forming the circuit becomes close to a trapezoid. The cross-sectional shape becomes a triangle in a further thinner circuit, and in an extreme example, the trailing becomes too large to configure the vertices of a triangle, the conductor thickness and the circuit width become smaller than the design value, whereby the circuit formation cannot be said as normal any longer. In a circuit having such a shape, there is also a problem that the electrical characteristics are not stable.

In the electrolytic pattern plating performed in the semi-additive method and the MSAP described in JP 2003-8222 A and JP 2007-88476 A, the problems such as the following (I) and (II) can be mentioned:

(I) The thickness of the conductor layer (plating thickness) is greatly affected by the density of the pattern.

The current density for performing the electrolytic pattern plating is affected by the density of the circuit pattern area, and therefore, when the surface includes a region having a dense pattern area and a region having a sparse pattern area, the distribution of the plating thickness becomes poorer. Therefore, it is difficult to make a surface having a uniform plating thickness. In particular, when the circuit pattern area on each of the front and back surfaces of the insulating board is not the same, the densities of the circuit patterns are largely different, and the like, the current density increases on the surface of the sparse pattern, and the conductor layer (plating thickness) becomes thicker. On the contrary, there are problems that the current density decreases on the surface of the dense pattern, and the conductor layer (plating thickness) becomes thinner.

(II) The reduction of the plating thickness by a sneak current value.

During the electrolytic pattern plating, when the areas of the circuit patterns are largely different on the front and back surfaces of the board, and different current values are passed on the front and back surfaces, the sneak current value phenomenon occurs on the surface of the lower current value. Therefore, when the boards are continuously input, the tendency that the plating thickness is reduced in accordance with the plating input order can be confirmed. It is necessary to input more boards than the number of normal dummy boards for the mitigation of the phenomenon, however, this does not solve the problem completely.

When different current values are passed on the front and back surfaces, the amount of sneak current value is different depending on the number of input boards. From the influence, the phenomenon that the plating thickness of each panel changes depending on the number of boards to be input occurs.

SUMMARY

The object of the present invention is to provide a printed wiring board where the influence of the density of the circuit pattern in each region on the conductor layer thickness is reduced when the circuit pattern area is different for each region of the printed wiring board, and a producing method thereof.

The printed wiring board according to this embodiment includes:

an insulating board including a conductive metal layer formed on both surfaces of an insulating resin; and a conductor layer formed on both surfaces of the insulating board, the conductor layer including a different circuit pattern depending on a region. The circuit patterns formed on both surfaces of the insulating board includes a pattern with line width accuracy of ±10 μm or less, and a conductor layer thickness in a region having a dense circuit pattern area and a conductor layer thickness in a region having a sparse circuit pattern area have a following relational expression:

$$\text{conductor layer thickness of dense region/conductor layer thickness of sparse region} = 0.7 \text{ to } 1.0.$$

The method of producing a printed wiring board according to this embodiment includes:

producing an insulating board obtained by forming a conductive metal layer on both surfaces of an insulating resin;

forming a plating resist on both surfaces of the insulating board, then performing exposure and development, and forming resist patterns different from each other on the respective surfaces;

performing electrolytic pattern plating on both surfaces of the insulating board where the resist pattern is formed, and forming a conductor layer configuring a circuit pattern having line width accuracy of ±10 μm or less and being different in pattern depending on a region;

removing the plating resist and the conductive metal layer from both surfaces of the insulating board, then forming a solder resist layer on both surfaces of the insulating board; and forming a dummy pattern and the circuit pattern in a region having a sparse circuit pattern area so that the circuit pattern area in a region having a dense circuit pattern area is 1.2 times to 1.0 times as large as the circuit pattern area in a region having a sparse circuit pattern area out of both surfaces of the insulating board, and removing the conductor layer from the dummy pattern after the the electrolytic pattern plating.

According to this embodiment, even when the density of the circuit pattern area is largely different for each of the regions, the conductor layer configuring a circuit pattern in each region has an approximately uniform thickness. Therefore, there is an effect that the current density becomes uniform, and that the manufacturing yield and the reliability can be improved.

According to the method of producing the printed wiring board in this embodiment, with respect to the difference of the circuit pattern area in each region of the printed wiring board, the density difference of the circuit pattern area in each region can be reduced and made uniform by a dummy pattern being added to a region having a sparse circuit pattern area. Therefore, the conductor layer thickness becomes stable and uniform.

In addition, conventionally, so that the influence of the density of the circuit pattern is reduced, the number of printed wiring board (products) to be cut out from one sheet of a panel has been limited. In the present invention, the dummy pattern is added to a region having a sparse circuit pattern area in a product, whereby the number of printed wiring boards (products) cut out from a panel is increased, and the productivity improvement and cost reduction can be achieved. The present invention can be also applied to a product where the dummy pattern cannot be added into the product to be shipped for reasons such as electrical characteristics.

When different current values are passed on both surfaces (front and back) of the printed wiring board, a sneak current occurs. As a result, the reduction of the plating thickness (the thickness of the conductor layer) occurs according to the input order of the plating. In contrast to this, the difference between the pattern densities of the front and back surfaces is reduced as described above, whereby the same current value can be passed on the front and back surfaces. Thereby, the sneak current does not occur, and the decrease of the plating thickness depending on the input order can be prevented. Due to this effect, the need to mitigate the reduction of plating thickness by using the dummy board is eliminated, and the productivity improvement and the cost reduction can be achieved by the number of dummy boards to be input being significantly reduced. Furthermore, the sneak current does not occur, and therefore, a plating thickness having a uniform thickness can be obtained irrespective of the number of input boards. Therefore, the quality of the printed wiring board becomes uniform, and the improvement of the manufacturing yield and the reliability can be achieved.

Furthermore, even when a plating bath unsuitable for the pattern plating is applied, a uniform plating thickness can be obtained.

DETAILED DESCRIPTION

Figure 1:
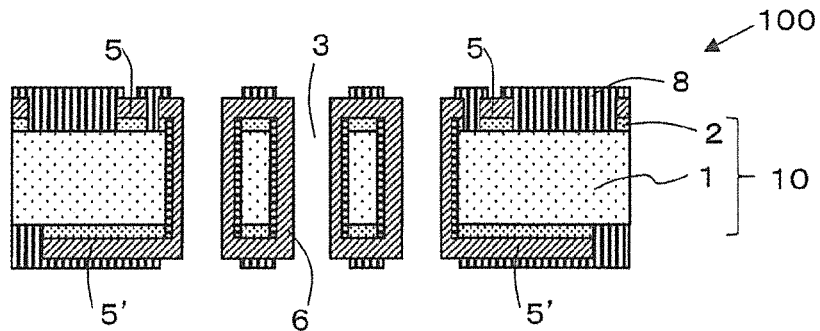
FIG. 1 is a cross-sectional view showing a printed wiring board according to an embodiment of the present invention.

The printed wiring board 100 according to the embodiment of the present invention is formed from an insulating board 10 including an insulating resin 1 and a conductive metal foil 2 (conductive metal layer) formed on both surfaces of the insulating resin 1, a via hole 3 penetrating the insulating board 10, a conductor layer 6 made of electrolytic pattern plating formed on an upper portion of the insulating board 10 and also on an inner wall surface of the via hole 3, and a solder resist 8, as shown in FIG. 1. On both surfaces of the insulating board 10, the circuit patterns 5 and 5' including the conductor layer 6 and having different pattern areas are formed.

As a material forming the insulating resin 1, for example, an epoxy resin, a bismaleimide-triazine resin, a polyimide resin, an organic resin such as a polyphenylene ether (PPE) resin can be mentioned. These organic resins may be used in a mixture of two or more thereof. When an organic resin is used as the insulating resin 1, the organic resin to which a reinforcing material is blended is preferred to be used. As the reinforcing material, for example, a glass fiber, a nonwoven glass fabric, an aramid nonwoven fabric, an aramid fiber, a polyester fiber, and the like can be mentioned. These reinforcing materials may be used in combination of two or more thereof. The insulating resin 1 is more preferably formed from an organic resin containing a glass material such as a glass fiber. Furthermore, the insulating resin 1 may include an inorganic filler material such as silica, barium sulfate, talc, clay, glass, calcium carbonate, and titanium oxide.

For example, when a circuit pattern is formed by the MSAP, the conductive metal foil 2 is attached on the surface of the insulating resin 1 as a seed layer of the electroplating, and the insulating board 10 is made by press processing or the like. As the conductive metal foil 2, for example a thin copper foil is preferred.

On the insulating board 10, the conductor layer 6 for forming the circuit pattern 5 is formed, and the via hole 3 penetrating the insulating board 10 is formed. The conductor layer 6 is also formed on the inner wall surface of the via hole 3. As the conductor layer 6, for example, the conductive resin layer, the metal plating layer, and the like can be mentioned, and in particular, a copper plating layer is preferred due to the ease of processing such as etching. The circuit patterns 5 and 5' include in part or in the whole a fine pattern having a line width of 50 μm or less, difficult to be produced in the subtractive method. It is preferred that the line width has the accuracy of ±10 μm or less.

The circuit patterns 5 and 5' are different patterns from each other, and are formed on both surfaces of the insulating board 10. Then, the thickness of the conductor layer 6 in a region having a dense area of the circuit patterns 5 and 5' and the thickness of the conductor layer 6 in a region having a sparse area are approximately uniform, and specifically, they have the following relational expression:

conductor layer thickness in a dense region/conductor layer thickness in a sparse region=0.7 to 1.0.

Here, in the example in this embodiment, the "region" means each of the front and back surfaces of the insulating board 10 having the corresponding one of the circuit patterns 5 and 5'. However, the present invention is not limited thereto, and the region may be, for example, a region having a different pattern area on a surface of the insulating board. In this case, a region having a dense pattern area and a region having a sparse pattern area do not necessarily have to be adjacent. The dense region and the sparse region may divide the entire surface into two parts using only the two regions, or may divide a part of the surface.

Next, the method of producing a printed wiring board according to an embodiment of the present invention will be described. The method of producing a printed wiring board according to the embodiment of the present invention includes the following steps (i) to (viii):

(i) a step of producing the insulating board obtained by laminating conductive metal foil on both surfaces of the insulating resin;

(ii) a step of producing a hole for via hole penetrating the insulating board;

(iii) a step of forming a plating resist on both surfaces of the insulating board, then performing exposure and development, and forming resist patterns different from each other on the respective surfaces;

(iv) a step of performing the electrolytic pattern plating on both sides of the insulating board, and forming a conductor layer configuring the circuit pattern and the dummy pattern where the pattern is different on each surface;

(v) a step of removing the dummy pattern by the subtractive method after the the electrolytic pattern plating;

(vi) a step of peeling off the plating resist and the etching resist;

(vii) a step of removing the conductive metal foil (seed layer); and (viii) a step of forming the solder resist.

The method of producing a printed wiring board according to the embodiment of the present invention will be described with reference to FIGS. 2A to 2K. The insulating resin 1, the conductive metal foil 2, the via hole 3, and the like are the same as described above, and details will be omitted.

Figure 2A:
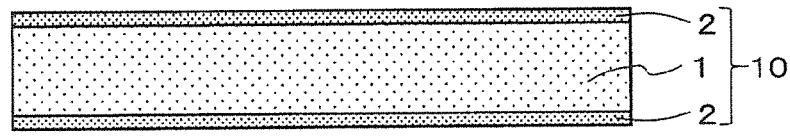
FIGS. 2A to 2K are cross-sectional views showing a producing method of a printed wiring board according to the embodiment of the present invention.

First, as shown in FIG. 2A, the insulating board 10 obtained by the conductive metal foil 2 being formed on both surfaces of the insulating resin 1 is prepared. As the conductive metal foil 2, for example, the thin copper foil having a thickness of about 3 μm is used. In the method of forming the insulating board 10, for example, the resin coated copper foil may be laminated on the insulating resin board, or for example, the copper foil with carrier including the thin copper foil with a thickness of 3 μm and the carrier foil with a thickness of 18 μm may be laminated on the insulating resin with the prepreg interposed therebetween. When the copper foil with carrier is used, the carrier foil is removed after the lamination. Furthermore, the insulating board 10 may be a copper-clad laminated board where the thin copper foil is preformed.

Figure 2B:
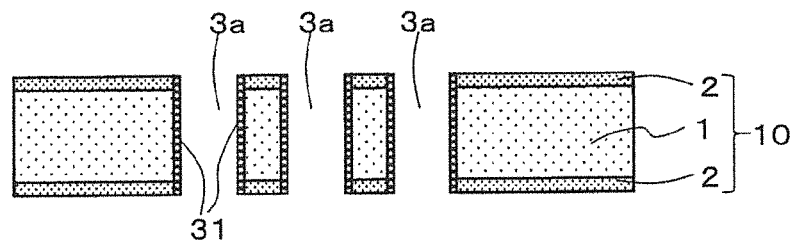

Next, as shown in FIG. 2B, the hole 3a for via hole penetrating the insulating board 10 is formed. The hole 3a for via hole may be formed by a drill or a laser beam being used. When the hole 3a for via hole is formed by a laser beam being used, the conductive metal foil 2 directly above the hole 3a for via hole may be opened at the same time.

The hole 3a for via hole may have the resin residue remaining on the inner wall surface and the like when any of the methods of the drill or the laser beam is used. In that case, the resin residue is removed by desmear processing.

Furthermore, the seed layer 31 is formed at least on the inner wall surface of the hole 3a for via hole by electroless plating.

Figure 2C:
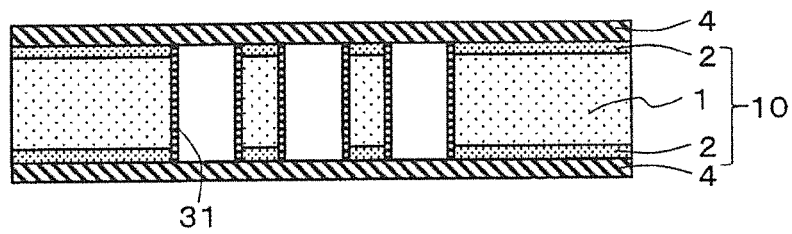

Next, as shown in FIG. 2C, the plating resist 4 for performing the electrolytic pattern plating described below is formed on both surfaces. As the plating resist 4, a dry film dedicated to the electrolytic pattern plating (such as RY-3525 manufactured by Hitachi Chemical Co.) is used, and is laminated on the insulating board 10.

Figure 2D:
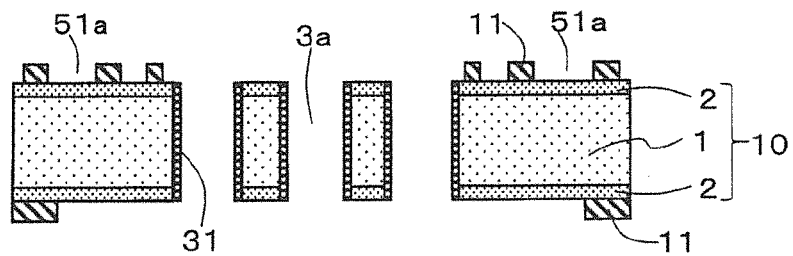

Next, as shown in FIG. 2D, the plating resist 4 is exposed and developed, and the plating resist pattern 11 for producing a circuit pattern portion and a dummy pattern described below is formed. Here, the plating resist opening for the dummy pattern is indicated by reference numeral 51a.

Figure 2E:
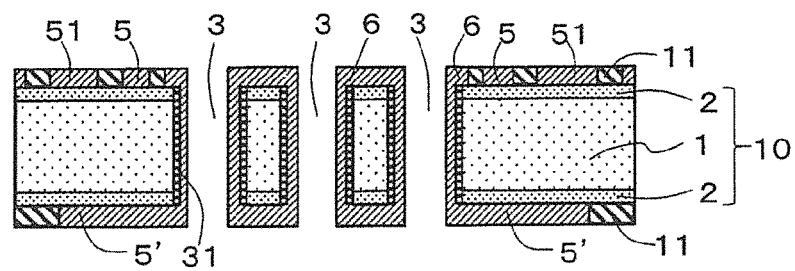

Next, as shown in FIG. 2E, the conductor layer 6 is formed on the inner wall surface of the hole 3a for via hole and both surfaces of the insulating board 10 by the electrolytic pattern plating being performed, and the via hole 3, the circuit patterns 5 and 5', and the dummy pattern 51 are formed. The plating thickness (conductor thickness) of the conductor layer 6 is set as, for example, 15 μm.

As described above, even though the circuit patterns 5 and 5' are patterns having different areas from each other, the thickness of the conductor layer 6 in the dense area region and the thickness of the conductor layer 6 in the sparse area region are approximately uniform. In order to form such circuit patterns 5 and 5', the circuit pattern 5 and the dummy pattern 51 are formed in the region having a sparse circuit pattern area so that the area of the circuit pattern 5' in a dense region having a large circuit pattern area is 1.2 times or less, preferably 1.2 times to 1.0 times, as large as the area of the circuit pattern 5 in a sparse region among the individual regions of the insulating board 10. Thereby, the circuit pattern area in each region of the insulating board 10 becomes approximately uniform, and the above-described relational expression can be achieved:

conductor layer thickness in a dense region/conductor layer thickness in a sparse region=0.7 to 1.0.

In the printed wiring board in size of 50 mm×50 mm to 150 mm ×150 mm, when the area ratio in density of the circuit patterns 5 and 5' has the following relational expression:

dense conductor area/sparse conductor area=5 or more, the following relational expression is obtained:

conductor layer thickness in a dense region/conductor layer thickness in a sparse region=0.4 to 1.0.

In contrast to this, introducing the dummy pattern 51 and suppressing the ratio to 1.2 or less makes it possible to reduce the difference between the conductor layer thicknesses in each region.

Figure 2F:
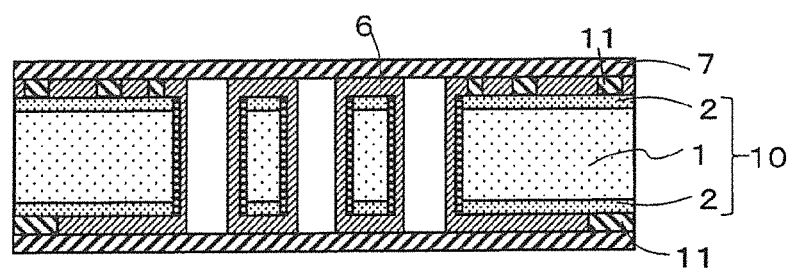
Figure 2G:
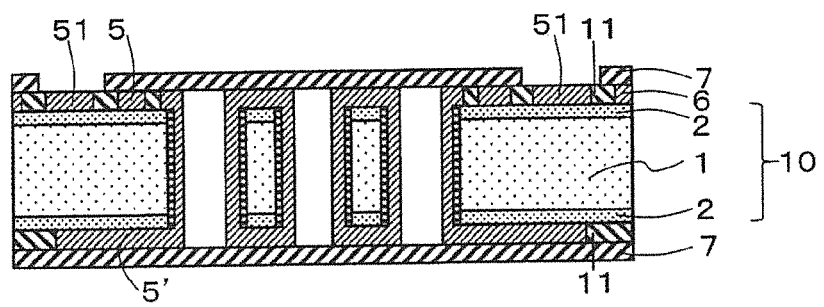

Next, as shown in FIG. 2F, the etching resist 7 of a dry film (such as AQ-1558 manufactured by Asahi Kasei E-Materials Co., Ltd.) is formed on the surfaces of the conductor layer 6, the via hole 3, the circuit patterns 5 and 5', and the dummy pattern 51. Then, as shown in FIG. 2G, the exposure and the development are performed, and the dummy pattern 51 is exposed.

Figure 2H:
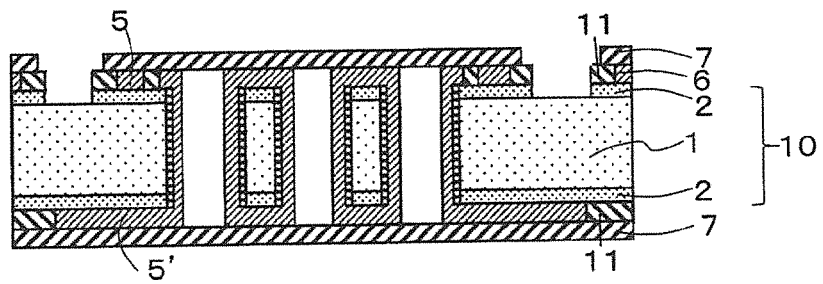

Next, as shown in FIG. 2H, the dummy pattern 51 is selectively removed by etching using the subtractive method. In this case, the conductive metal foil 2 underside of the dummy pattern 51 is also removed.

Figure 2I:
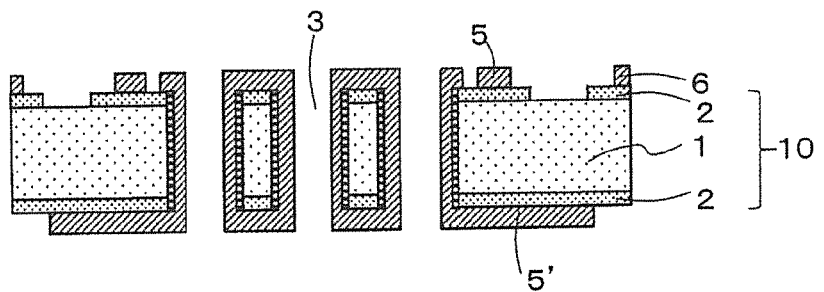

Next, as shown in FIG. 2I, the etching resist 7 and the plating resist pattern 11 are peeled off.

Figure 2J:
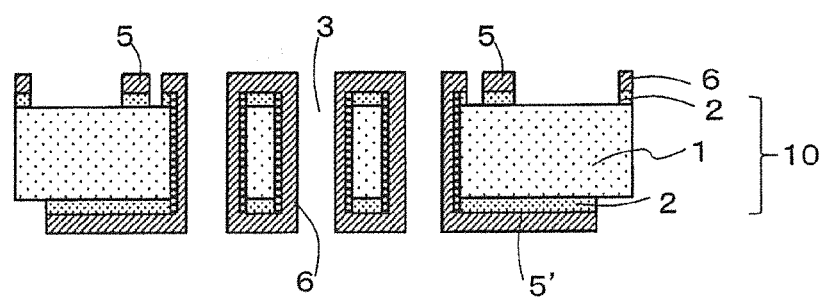

Next, as shown in FIG. 2J, the conductive metal foil 2 exposed from the conductor layer 6 is removed by flash etching.

Figure 2K:
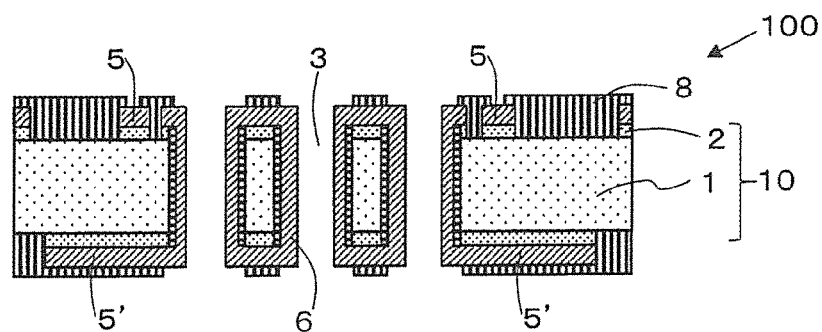

Lastly, as shown in FIG. 2K, the solder resist 8 is formed in a predetermined position on the surface, and the printed wiring board 100 is obtained. The method of forming the solder resist 8 includes: firstly using the spray coating, roll coating, curtain coating, screen method, and the like; and applying and drying the photosensitive liquid solder resist, or pasting the photosensitive dry film solder resist by roll lamination. Then, the pad portion may be opened by the exposure and the development, heated and hardened, and the outer shape processing may be performed. The solder resist thickness is set as, for example, 20 μm.

Before the solder resist 8 is formed, the forming surface may be subjected to the roughening processing of copper such as the CZ processing. In the opening of the solder resist 8, the electroless nickel plating may be formed with a thickness of 3 μm or more, and thereon, the electroless gold plating may be formed with a thickness of 0.03 μm or more (preferably 0.05 μm or more, 0.3 μm or more for the wire bonding applications). Furthermore, sometimes the solder precoat is performed thereon. It may be formed by the electrolytic plating, rather than the electroless plating. Rather than the plating, the water-soluble anticorrosive organic coating (such as Glicoat-SMD manufactured by Shikoku Chemicals Corp.) may be formed, or the electroless silver plating, or the electroless tin plating may be formed.

The present invention is not intended to be limited to the embodiment described above, and various modifications and improvements are possible within the scope of the claims.

For example, although the method of producing the printed wiring board shown in this embodiment is described by exemplifying the double-sided board, the method is not limited to the double-sided board, and is applicable to a multilayer board, a build-up multilayer board, and the like, and it is needless to say that the method can be applied to the circuit surface of any printed wiring board such as the outer layer circuit, and the inner layer circuit.

In the above, although the circuit forming method is described using the MSAP, the method is not intended to be limited to the MSAP, and even the semi-additive method can be applied.

The via hole is not limited to the through-hole, and is also applicable to the non-through hole.

What is claimed is:

1. A printed wiring board comprising:
    an insulating board including a conductive metal layer formed on both surfaces of an insulating resin; and
    a conductor layer formed on both surfaces of the insulating board, the conductor layer including a different circuit pattern depending on a region,
    wherein the circuit patterns formed on both surfaces of the insulating board includes a pattern with line width accuracy of ±10 μm or less, and
    wherein a conductor layer thickness in a region having a dense circuit pattern area and a conductor layer thickness in a region having a sparse circuit pattern area have a following relational expression:

conductor layer thickness in a dense region/conductor layer thickness in a sparse region=0.7 to 1.0.

2. The printed wiring board according to claim 1, wherein the printed wiring board has a size of 50 mm×50 mm to 150 mm×150 mm.

3. The printed wiring board according to claim 1, wherein the insulating board includes a via hole containing a conductor layer formed on an inner wall surface of the via hole.

4. The printed wiring board according to claim 1, wherein the circuit pattern includes a pattern having a line width of 50 μm or less.

5. The printed wiring board according to claim 1, wherein the region includes a front surface and a back surface having a different circuit pattern from each other of the insulating board.

6. The printed wiring board according to claim 1, wherein the region includes a region different in circuit pattern area on a surface of the insulating board.

7. A method of producing a printed wiring board, the method comprising:
    producing an insulating board obtained by forming a conductive metal layer on both surfaces of an insulating resin;
    forming a plating resist on both surfaces of the insulating board, then performing exposure and development, and forming resist patterns different from each other on the respective surfaces;
    performing electrolytic pattern plating on both surfaces of the insulating board where the resist pattern is formed, and
    forming a conductor layer configuring a circuit pattern having line width accuracy of ±10 μm or less and being different in pattern depending on a region;
    removing the plating resist and the conductive metal layer from both surfaces of the insulating board, then forming a solder resist layer on both surfaces of the insulating board; and
    forming a dummy pattern and the circuit pattern in a region having a sparse circuit pattern area so that the circuit pattern area in a region having a dense circuit pattern area is 1.2 times to 1.0 times as large as the circuit pattern area in a region having a sparse circuit pattern area out of both surfaces of the insulating board, and removing the conductor layer from the dummy pattern after the the electrolytic pattern plating.

8. The method of producing a printed wiring board according to claim 7, wherein a conductor layer thickness in a region having a dense conductor layer area and a conductor layer thickness in a region having a sparse conductor layer area have the following relational expression:

conductor layer thickness in a dense region/conductor layer thickness in a sparse region=0.7 to 1.0.

9. The method of producing a printed wiring board according to claim 7, wherein the step of removing the conductor layer from the dummy pattern includes removing the conductor layer from the dummy pattern by a subtractive method.

10. The method of producing a printed wiring board according to claim 7, wherein the step of forming a conductor layer includes forming a hole for via hole in the insulating board, performing electrolytic pattern plating on an inner wall surface of the hole for via hole and both surfaces of the insulating board, and forming a conductor layer.

* * * * *